April 12, 1966 L. H. DE VAUX ET AL 3,245,848

METHOD FOR MAKING A GALLIUM ARSENIDE TRANSISTOR

Filed July 11, 1963 2 Sheets-Sheet 1

INVENTORS.
LLOYD H. DE VAUX,
SIMON STOPEK,
BY John M. Koch
ATTORNEY.

INVENTORS.
LLOYD H. DE VAUX,
SIMON STOPEK,
John M. Koch
ATTORNEY 3,245,848

METHOD FOR MAKING A GALLIUM ARSENIDE TRANSISTOR

Lloyd H. De Vaux, Santa Barbara, Calif., and Simon Stopek, Wayland, Mass., assignors to Hughes Aircraft Company, Culver City, Calif., a corporation of Delaware Filed July 11, 1963, Ser. No. 294,294
7 Claims. (Cl. 148—186)

Figure 1:
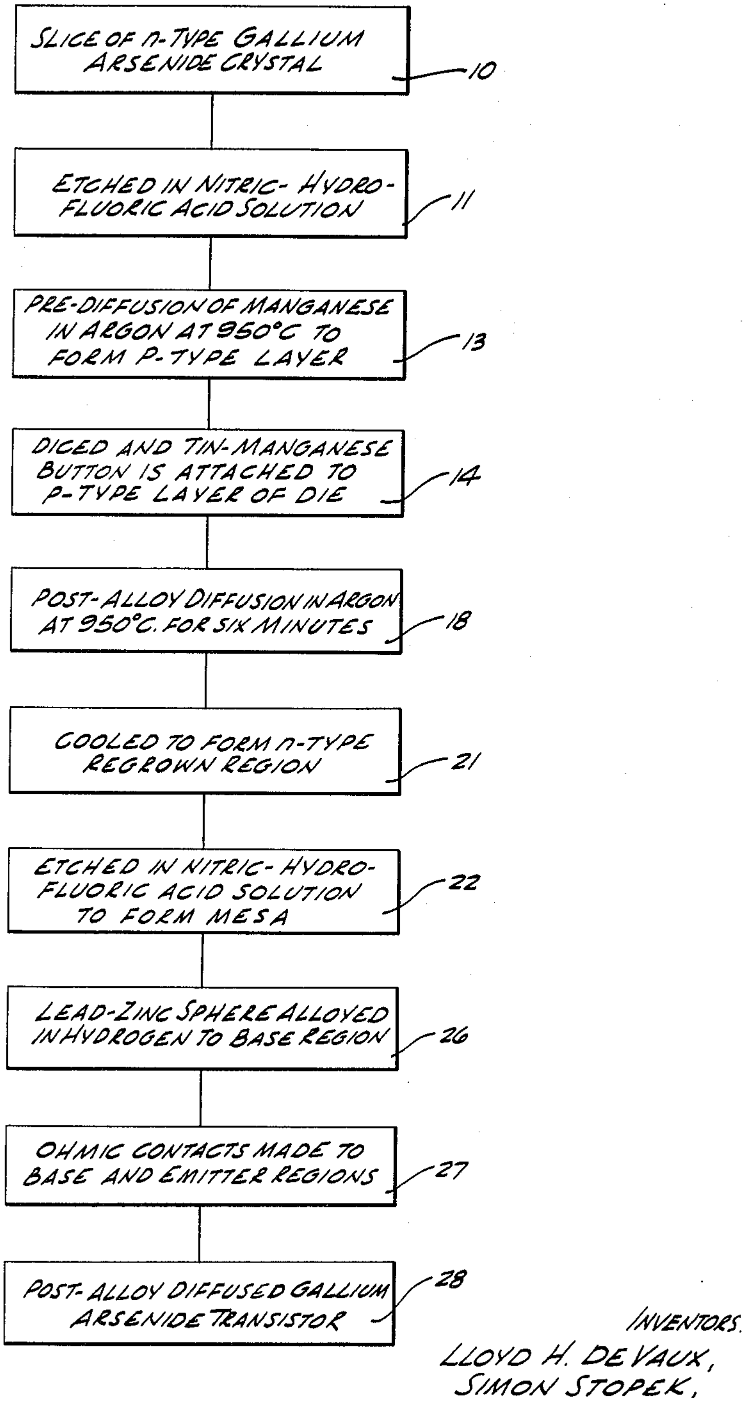

This invention relates to a method of making a transistor structure of gallium arsenide.

Gallium arsenide is a material having very desirable properties for use in semiconductor devices. It more than combines the best features of semiconductor materials such as germanium and silicon. Among its desirable properties, when used in semiconductor devices, are high frequency, larger band gap and higher power operation, high temperature capabilities, the ability to operate at higher voltages, and higher resistance to radiation, than germanium or silicon. The use of gallium arsenide in semiconductor devices in normal environments solves some of the cooling problems presented by other types of semiconductor devices. In dense packaging environments, for example, the use of gallium arsenide requires little or no cooling, in distinction to germanium or silicon, which require considerable cooling under such circumstances.

Serious problems are involved in the use of gallium arsenide in various semiconductor devices. In addition to the difficulties encountered in preparing sufficiently pure gallium arsenide, a dearth of knowledge confronts the potential user of gallium arsenide in semiconductor devices. Stability problems have to be solved and suitable processing steps have to be developed before satisfactory semiconductor devices can be made of gallium arsenide. Furthermore, before such production methods can be used commercially, inexpensive mass production techniques have to be developed.

Accordingly, it is an important object of this invention to provide an inexpensive method, adapted for commercial mass production techniques, for the production of gallium arsenide transistors having various desirable properties.

Another object of this invention is to provide a method for commercial production of gallium arsenide transistors having large band gap and capable of operating at high frequency, high power and high temperatures.

Additional objects will become apparent from the following description, which is given primarily for purposes of illustration, and not limitation.

Stated in general terms, the objects of this invention are attained in a preferred embodiment described in detail below with reference to FIGS. 1 and 2, by first forming a thin p-type layer upon a crystal of n-type gallium arsenide by prediffusion of manganese into the gallium arsenide crystal. This prediffused p-type layer is of assistance in reducing the transistor base resistance. This is especially helpful when very thin transistor base widths are required. This prediffusion step is performed as follows.

A tin-manganese alloy button, which acts as a diffusant source, an emitter source, and an emitter contact, is alloyed to a slice of n-type gallium arsenide at a sufficiently high temperature to cause diffusion of manganese into the gallium arsenide in advance of the alloy front. This operation is performed in a closed quartz capsule under a low pressure of an inert or noble gas, such as one-fourth atmosphere of argon, to prevent the escape of arsenic. In this manner, the decomposition of gallium arsenide also is prevented, and vaporized manganese exists over the gallium arsenide crystal to maintain a p-type surface thereover. This surface provides a means of making ohmic contact to the base of the transistor structure. The duration of the time during which the structure is maintained at this high tin-manganese alloying and diffusion temperature, determines the base width of the transistor structure. Conditions then are chosen for a post-alloy diffusion step so as to make certain that the alloy front penetrates through the prediffused junction produced, and the post-alloy diffusion step is conducted accordingly.

The resulting structure is cooled to form a regrown region, which is n-type, due to the presence of the tin. Ohmic contact to the base region is made by alloying lead, containing a p-type dopant such as manganese, zinc, cadmium or copper to the surface of the gallium arsenide crystal. The transistor collector contact is made by alloying a gold-clad molybdenum tab, containing an n-type dopant such as tin, selenium, or tellurium, to the bottom of the gallium arsenide crystal. The collector junction is adjusted to a suitable size by masking the top surface thereof and etching a mesa thereon. The ohmic contacts to the transistor base and collector are made at temperatures considerably lower than the post-alloy diffusion temperature.

Figure 2:
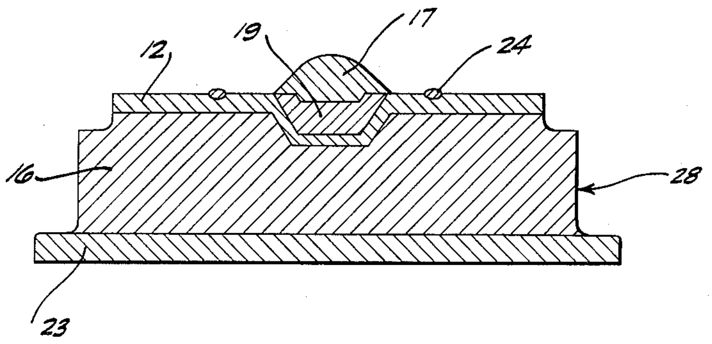

A more detailed description of a specific embodiment of this invention is given below with reference to the accompanying drawing, wherein:

FIG. 1 is a flow sheet diagrammatically outlining the principal method steps for fabricating a post-alloy diffused gallium arsenide transistor; and FIG. 2 is a schematic elevational view in section showing the structure of a post-alloy diffused gallium arsenide transistor fabricated by the method of FIG. 1.

In accordance with the preferred embodiment of this invention, as outlined in flow-sheet form in FIG. 1, a gallium arsenide transistor, shown in FIG. 2, is prepared as follows. Each slice 10, of a plurality of slices, of a single crystal of n-type gallium arsenide, containing about $5 \times 10^{16}$ donors per cubic centimeter, is lapped and polished in a conventional manner. The polished gallium arsenide slice is oriented with its (111) crystal axis direction normal to the flat sides of the slice. Each slice, thus oriented, is etched for 15 seconds in an etching solution containing three parts concentrated nitric acid, two parts water and one part concentrated hydrofluoride acid, as indicated at 11. Each etched slice is then thoroughly washed in deionized water, dried and placed in a quartz diffusion capsule.

Next, upon each slice 10 is formed a prediffusion layer of manganese to form a p-type layer 12 about 20 microns deep, as indicated at 13. This prediffusion layer 12 is formed in a quartz diffusion capsule, while it is sealed off from the atmosphere, and contains one-fourth atmosphere pressure of argon. The argon serves to reduce the decomposition of the gallium arsenide crystal 10 at the diffusion temperature employed. The prediffusion layer of manganese is produced as follows.

A 20 milligram piece of pure manganese is etched in a solution of nitric acid and methanol, washed in methanol, and dried. The dried, etched piece of manganese is then placed in the quartz diffusion capsule together with the etched slice of gallium arsenide 10, prepared as described immediately above. The slice of gallium arsenide 10 and the manganese diffusant are placed in separate compartments of a flat bottomed quartz crucible, inside the quartz diffusion capsule. The gallium arsenide slice 10 is oriented so that the "A" side thereof is upward.

The quartz diffusion capsule is evacuated to a pressure less than $10^{-4}$ mm. Hg, and is then back-filled with pure dried argon to a final pressure of one-fourth atmosphere absolute. The quartz diffusion capsule is then sealed off.

A prediffusion operation 13 then is carried out in a tube furnace at 950° for about 15 minutes. The exact time employed depends upon the impurity concentration of the gallium arsenide crystal employed.

After removing the gallium arsenide crystal slice 10 from the diffusion capsule, the "B" side of the slice is ground to remove the diffused p-type layer 12 therefrom. The ground slice is then cut into rectangular dice, as indicated at 14. Each die 16 contains a diffused p-type layer 12 on one side thereof. A tin-manganese button 17, containing 5% manganese, is attached to the p-type layer 12 of the die 16 by heating the die on a strip heater in an atmosphere of hydrogen, as indicated at 14. A low temperature is used in this step to prevent the penetration of the tin-manganese alloy into the gallium arsenide die 16. The purpose of this prealloying step is merely to attach the tin-manganese button 17 to the die 16 to facilitate subsequent handling thereof.

The resulting pelleted die is placed in a quartz diffusion capsule, along with other similarly treated dice, with the tin-manganese alloy pellet or button attached thereto, positioned upward. A 20 milligram piece of manganese, prepared in a manner identical with that described hereinabove, also is placed in the quartz diffusion capsule. The quartz diffusion capsule is evacuated, back-filled with argon, and sealed off, as described hereinabove. The resulting quartz diffusion capsule is heated to 960° C. for one minute, and then the temperature is reduced to 950° C., at which temperature it is maintained for six minutes, as indicated at 18. The length of time at 950° C. determines the base width of the structure produced. The purpose of the 10° C. temperature drop is to guard against an upward fluctuation of temperature, which might wipe out the diffusion front. This capsule then is slowly cooled, at a rate of about 30° C. per minute, until it reaches 600° C. The capsule then is slowly removed from the furnace. This results in the formation of a regrown region 19, which is n-type due to the presence of the tin. This step is illustrated in the flow sheet of FIG. 1 at 21.

As mask of wax is placed on the tin-manganese alloy of the resulting structure, and the region of the gallium arsenide area surrounding it. A mesa, as shown in FIG. 2, then is etched on the resulting structure, using the nitric acid-hydrofluoric acid etching solution described hereinabove, and as indicated at 22. The mesa etching solution also cleans the collector junction and removes any p-type layer, which might have formed on the B side of the die during the post-alloying diffusion operation.

The resulting die structure is mounted on a tin-coated, gold-clad molybdenum tab 23 and a lead-zinc sphere 24 containing 2% zinc, is alloyed to the base region of the die structure, as shown at 26. This die mounting is accomplished on a strip heater within a hydrogen atmosphere, at a temperature only sufficiently high to ensure wetting of the die structure. The emitter and base contact of the die structure are cleaned by electro-polishing the resulting assembly in an acid solution containing one part hydrochloric acid in 25 parts water, at a current density of 200 ma./in.$^2$ amid agitation. Wire contacts are made to the emitter and base contacts thus formed, as indicated at 27, by conventional thermal bonding or microsoldering techniques, to produce the post-alloyed diffused gallium arsenide transistor 28.

Instead of employing the lapping, dicing and prealloying steps as described above in the specific embodiment, a matrix can be evaporated through a mask and the dicing operation can be done later. This procedure also lends itself to stripe emitter geometries which can be favorable for some purposes. A whole array of dot emitters can be alloyed, for example, followed by a dicing operation.

Similary, in the etching, mounting and lead attachment operations, a matrix and again be evaporated for better base geometry, such as a ring for a dot emitter, or two stripes for a stripe emitter. This can be done before the mesa masking and etching operation.

In a variation of the preferred embodiment of FIGS. 1 and 2, a pure tin alloy button, instead of a tin-manganese alloy, is used. The manganese necessary for the post-alloy diffusion is contained in the dissolved gallium arsenide as a result of the manganese prediffusion. The remaining steps employed in this variation of the preferred embodiment are identical with those given above, beyond step 18 of FIG. 1.

In an alternative method, the manganese prediffusion step 13, FIG. 1, described in the preferred embodiment, is eliminated; and a tin-manganese alloy button is alloyed to a slice of n-type gallium arsenide in a closed quartz capsule, which also contains an amount of elemental manganese. This eliminates the prediffusion step 13, FIG. 1, and combines it with the post-alloy diffusion step 18, thus reducing the total number of steps. The manganese vapor produces the base region by diffusion simultaneously with the post-alloy diffusion. The remaining steps, after step 18, are identical with those of the preferred embodiment.

An additional alternative embodiment of the invention involves the use of a technique for the simultaneous formation of the post-alloy diffused transistor structure and all ohmic contacts, thus eliminating steps 13 through 18 of the preferred embodiment of FIG. 1. The emitter alloy button contains both an n-type and a p-type dopant, such as tin-manganese alloy described above, and the base ohmic contact contains the same p-type dopant, such as the lead-manganese alloy. The collector contact contains an n-type dopant such as tin. By adjusting the masses of the various alloys, and the time and temperature employed in the diffusion step, which is equivalent to step 18, a transistor structure is produced. A mesa is formed on this structure by the use of the technique given hereinabove in step 22 of the preferred embodiment.

Obviously, many other modifications and variations of the present invention are possible in the light of the above teachings. It is therefore to be understood that within the scope of the appended claims, the invention can be practiced otherwise than as specifically described.

What is claimed is:

1. A method for fabricating a gallium arsenide transistor which comprises: alloying a button of tin maganese to an n-type crystal of gallium arsenide in an inert atmosphere, subjecting the alloyed structure to a diffusion step at about 950° C. to diffuse manganese into said crystal; cooling said system to form an alloy regrown crystal region of n-type separated from the n-type material of original crystal structure by a region p-type material formed by said diffusion step, and making ohmic contacts to said p-type region and the respective n-type regions.

2. A method for fabricating a gallium arsenide transistor which comprises: treating an n-type crystal of gallium arsenide with manganese in an inert atmosphere at a pressure to prevent the escape of arsenic, at elevated temperatures so as to cause a portion of the gallium arsenide to be converted to p-type, alloying a button of tin manganese to said crystal on said portion and heating the same to diffuse manganese from said alloy to form a region of p-type material contiguous with said portion, cooling the resulting structure to form a regrown n-type region adjacent said manganese difused p-type region, and making ohmic contacts to said regrown n-type region, said manganese diffused p-type material and the original n-type region of said crystal.

3. A method according to claim 1 wherein said tin manganese alloy comprises about 95% tin and 5% manganese.

4. A method according to claim 1 wherein manganese is diffused from the alloy regrown region of said crystal after cooling thereof.

5. A method for fabricating a gallium arsenide transistor which comprises: treating an n-type crystal of gallium arsenide with manganese in an inert atmosphere, at a pressure to prevent the escape of arsenic, at elevated temperatures so as to cause a portion of the gallium arsenide to be converted to p-type, alloying a button of tin to said crystal on said portion and heating the same to diffuse manganese from said alloy to form a region of p-type material contiguous with said portion, cooling the resulting structure to form a regrown n-type region adjacent said manganese diffused p-type region and making ohmic contacts to said regrown n-type region, said manganese diffused p-type material and the original n-type region of said crystal.

6. A method for fabricating a gallium arsenide transistor which comprises: alloying a button of tin manganese to an n-type crystal of gallium arsenide in a system containing elemental manganese and in an inert atmosphere, subjecting the alloyed structure to a diffusion step at about 950° C. to diffuse manganese into said crystal; cooling said system to form an alloy regrown crystal region of n-type separated from the n-type material of original crystal structure by a region p-type material formed by said diffusion step, and making ohmic contacts to said p-type region and the respective n-type regions.

7. A method according to claim 6 wherein said system is closed, and said system atmosphere is formed prior to heating by evacuation followed by back filling with argon to a pressure of about one quarter atmosphere.

References Cited by the Examiner

UNITED STATES PATENTS

| | | | |
|---|---|---|---|
| 2,900,286 | 8/1959 | Goldstein | 148—189 |
| 2,978,617 | 4/1961 | Dorendorf | 148—189 |
| 3,012,175 | 12/1961 | Jones | 148—185 |
| 3,041,508 | 6/1962 | Henkel et al. | 148—185 |
| 3,057,762 | 10/1962 | Gans | 148—189 |
| 3,070,467 | 12/1962 | Fuller | 148—188 |
| 3,087,100 | 4/1963 | Savadellis | 148—189 |
| 3,099,776 | 7/1963 | Henneke | 148—185 |
| 3,100,849 | 11/1963 | Soltys | 148—185 |

HYLAND BIZOT, *Primary Examiner.*